US009012951B2

(12) United States Patent
Preuss

(10) Patent No.: US 9,012,951 B2
(45) Date of Patent: Apr. 21, 2015

(54) RADIATION-EMITTING COMPONENT AND METHOD FOR PRODUCING A RADIATION-EMITTING COMPONENT

(75) Inventor: Stephan Preuss, Bad Abbach (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/819,094

(22) PCT Filed: Aug. 9, 2011

(86) PCT No.: PCT/EP2011/063701
§ 371 (c)(1),
(2), (4) Date: Apr. 2, 2013

(87) PCT Pub. No.: WO2012/025377
PCT Pub. Date: Mar. 1, 2012

(65) Prior Publication Data
US 2013/0200417 A1 Aug. 8, 2013

(30) Foreign Application Priority Data
Aug. 26, 2010 (DE) .......................... 10 2010 035 490

(51) Int. Cl.
*H01L 33/00* (2010.01)
*H01L 33/50* (2010.01)
(Continued)

(52) U.S. Cl.
CPC ................. *H01L 33/50* (2013.01); *H01L 33/38* (2013.01); *H01L 33/44* (2013.01); *H01L 33/504* (2013.01); *H01L 33/505* (2013.01); *H01L 2224/32245* (2013.01); *H01L 2224/48091* (2013.01);
(Continued)

(58) Field of Classification Search
CPC ....... H01L 33/50; H01L 33/505; H01L 33/38; H01L 33/504; H01L 33/44; H01L 2924/0002; H01L 2224/73265; H01L 2224/48247; H01L 2224/48091
USPC ............... 257/13, 79, 94, 98, 99, 100, 95, 96, 257/103, E33.008, E33.072, E33.001
See application file for complete search history.

(56) References Cited

U.S. PATENT DOCUMENTS

| 6,603,146 B1 | 8/2003 | Hata et al. |
| 6,878,973 B2 | 4/2005 | Lowery et al. |
| 7,318,651 B2 | 1/2008 | Chua et al. |

(Continued)

FOREIGN PATENT DOCUMENTS

| DE | 102 37 010 A1 | 5/2003 |
| DE | 102 61 428 A1 | 7/2004 |

(Continued)

OTHER PUBLICATIONS

English Translation of the Examination Report issued in the corresponding Korean patent application dated Jul. 16, 2014.

(Continued)

*Primary Examiner* — Cuong Q Nguyen
*Assistant Examiner* — Yosef Gebreyesus
(74) *Attorney, Agent, or Firm* — DLA Piper LLP (US)

(57) ABSTRACT

A radiation-emitting component including a semiconductor chip having a semiconductor body with an active region that generates a primary radiation, and including a conversion element that at least partly converts the primary radiation, wherein the conversion element is fixed to the semiconductor chip with a connecting layer and a radiation conversion substance is formed in the connecting layer.

11 Claims, 4 Drawing Sheets

(51) Int. Cl.
*H01L 33/38* (2010.01)
*H01L 33/44* (2010.01)

(52) U.S. Cl.
CPC ............... *H01L2224/48247* (2013.01); *H01L 2224/73265* (2013.01); *H01L 2924/0002* (2013.01)

(56) References Cited

U.S. PATENT DOCUMENTS

| | | | |
|---|---|---|---|
| 2001/0000622 A1* | 5/2001 | Reeh et al. | 257/98 |
| 2003/0071568 A1 | 4/2003 | Lowery et al. | |
| 2005/0151141 A1 | 7/2005 | Grotsch et al. | |
| 2007/0221867 A1 | 9/2007 | Beeson et al. | |
| 2008/0079017 A1 | 4/2008 | Loh et al. | |
| 2008/0116467 A1* | 5/2008 | Mueller et al. | 257/89 |
| 2008/0121911 A1 | 5/2008 | Andrews et al. | |
| 2008/0203410 A1 | 8/2008 | Brunner et al. | |
| 2010/0084678 A1 | 4/2010 | Streubel et al. | |
| 2010/0276722 A1* | 11/2010 | Baur et al. | 257/99 |

FOREIGN PATENT DOCUMENTS

| | | | |
|---|---|---|---|
| DE | 103 51 397 A1 | 6/2005 | |
| DE | 10 2005 045 106 A1 | 6/2006 | |
| JP | 2007103901 | 4/2007 | |
| KR | 1020090082499 | 7/2009 | |
| WO | 2007/023411 A1 | 3/2007 | |
| WO | 2009/039801 A1 | 4/2009 | |
| WO | WO 2009148176 A1 * | 12/2009 | C09K 11/77 |

OTHER PUBLICATIONS

Schmitzer I., et al., "30% External Quantum Efficiency from Surface Textured, Thin-Film Light-Emitting Diodes," Appl. Phys. Lett. 63 (16), Oct. 18, 1993, pp. 2174-2176.

English translation of corresponding Office Action of CN Application No. 201180041377.6 dated Dec. 31, 2014.

* cited by examiner

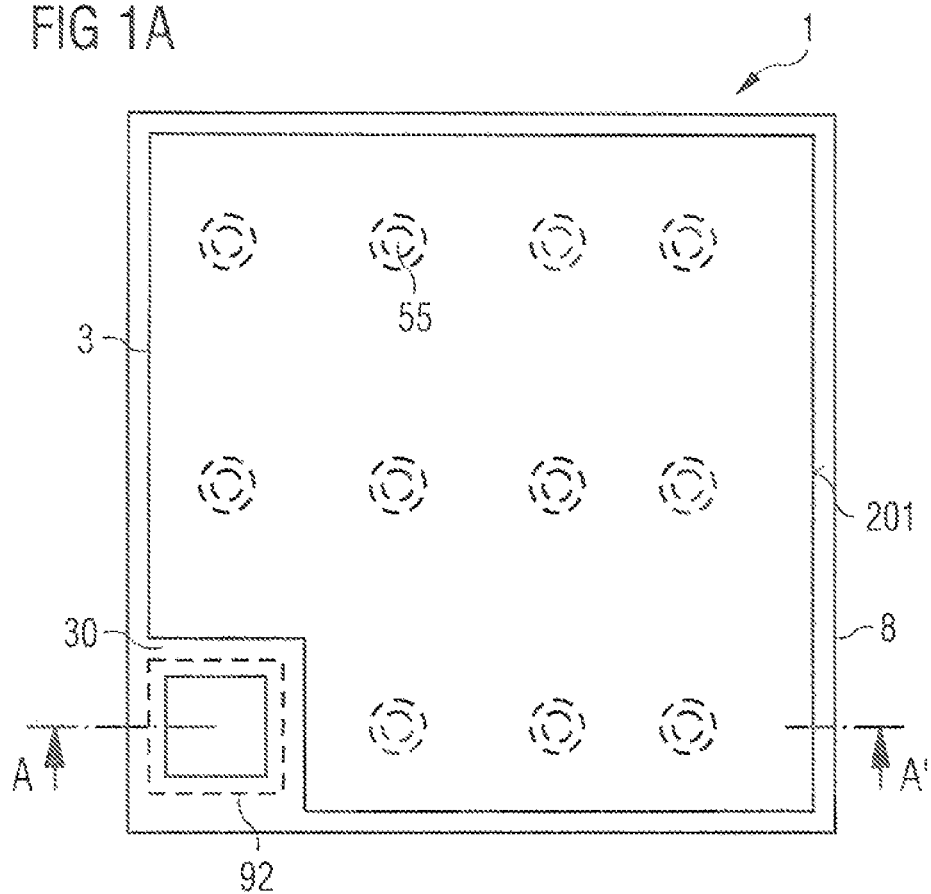
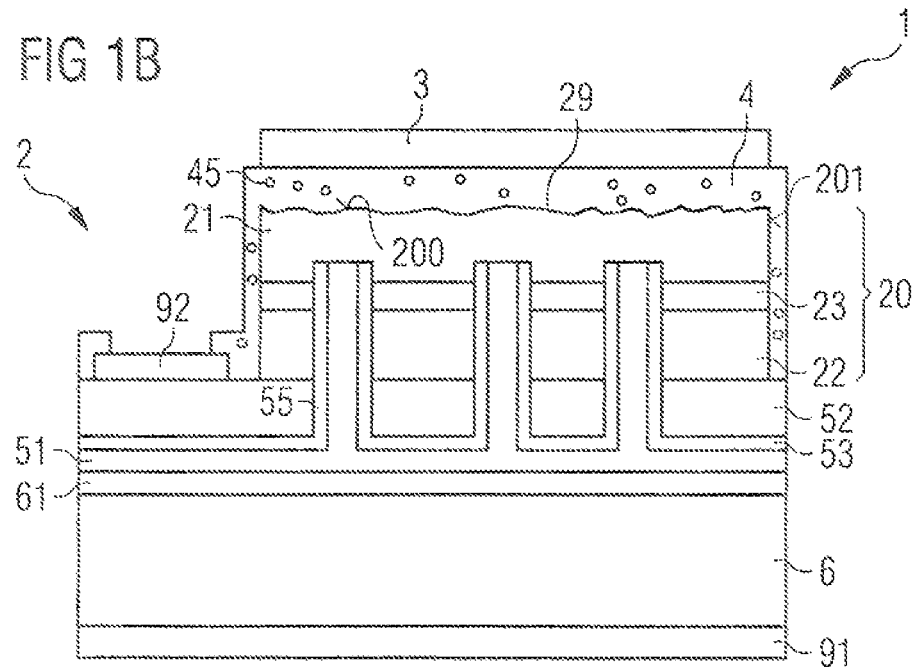

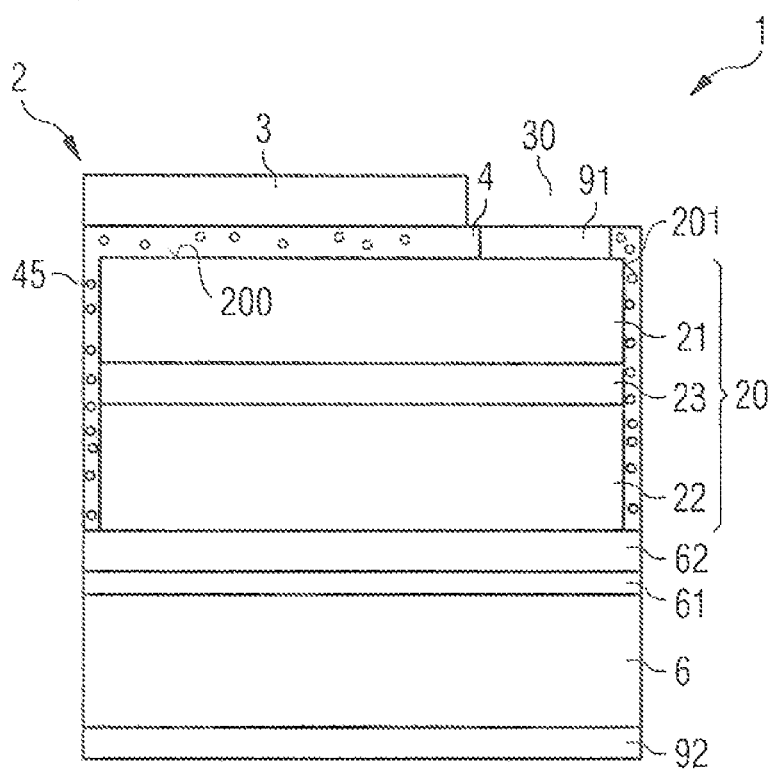

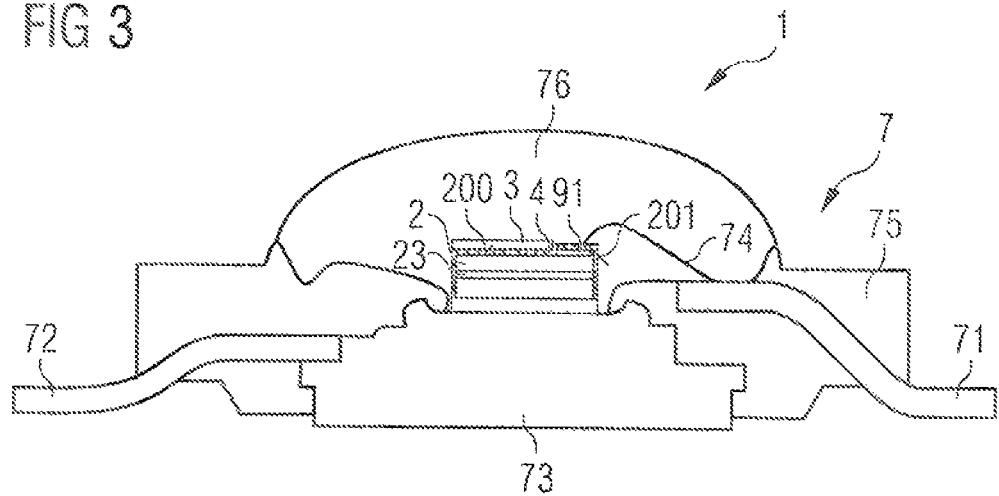
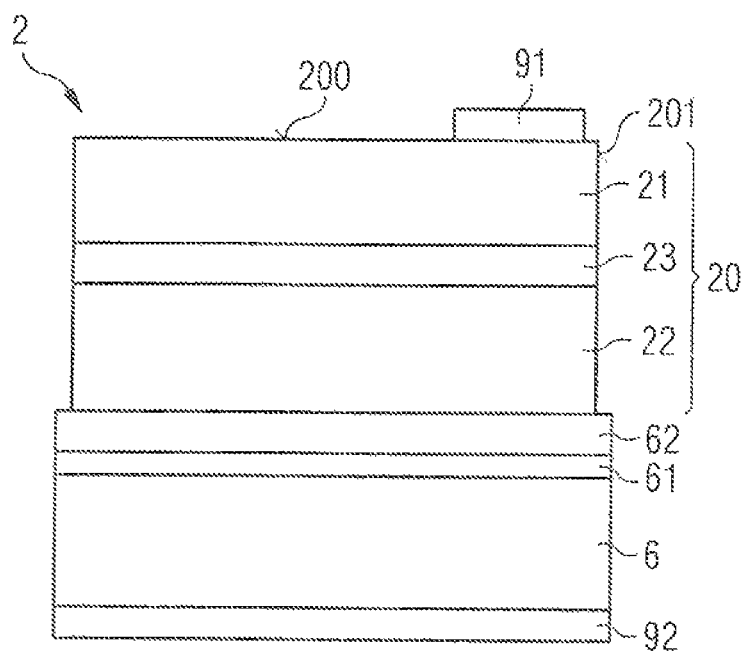

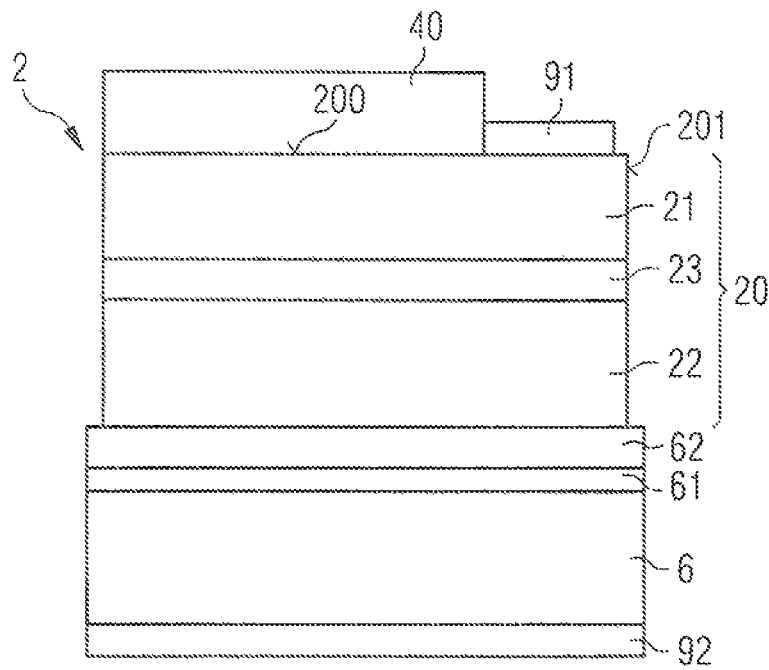
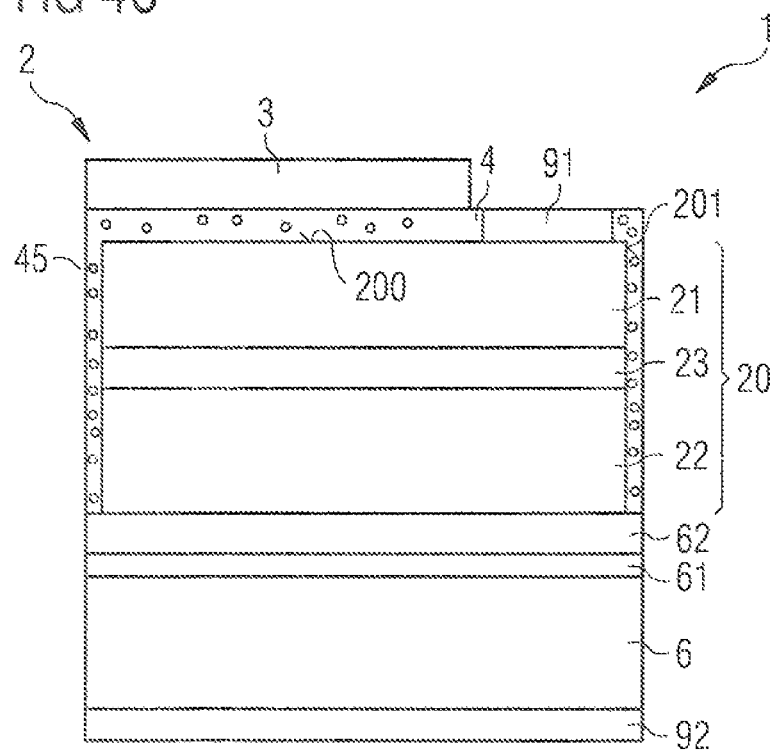

RADIATION-EMITTING COMPONENT AND METHOD FOR PRODUCING A RADIATION-EMITTING COMPONENT

RELATED APPLICATIONS

This is a §371 of International Application No. PCT/EP2011/063701, with an international filing date of Aug. 9, 2011 (WO 2012/025377 A1, published Mar. 1, 2012), which is based on German Patent Application No. 10 2010 035 490.2 filed Aug. 26, 2010, the subject matter of which is incorporated herein by reference.

TECHNICAL FIELD

This disclosure relates to a radiation-emitting component and to a method of producing a radiation-emitting component.

BACKGROUND

To generate white light by light-emitting diodes, conversion material can be applied on a semiconductor chip provided to generate radiation, the conversion material converting the primary radiation generated in the semiconductor chip such that mixed light that appears white to the human eye arises. The conversion material can be fixed on the semiconductor chip, for example, in the form of prefabricated conversion plates.

Primary radiation not converted or only a small portion of which is converted, for example, primary radiation emitted laterally past the conversion material, can cause an undesirable dependence of the color locus, that is to say of the coordinates $(C_x, C_y)$ in the CIE chromaticity diagram of the emitted radiation on the emission angle.

It could therefore be helpful to provide a radiation-emitting component in which the dependence of the color locus on the emission angle is reduced. Furthermore, it could be helpful to provide a method by which a radiation-emitting component can be produced efficiently and reliably.

SUMMARY

I provide a radiation-emitting component including a semiconductor chip having a semiconductor body with an active region that generates a primary radiation, and including a conversion element that at least partly converts the primary radiation, wherein the conversion element is fixed to the semiconductor chip with a connecting layer and a radiation conversion substance is formed in the connecting layer.

I also provide a radiation-emitting component including a semiconductor chip having a semiconductor body with an active region that generates a primary radiation, and including a conversion element that at least partly converts the primary radiation, wherein the conversion element is a prefabricated conversion fixed to the semiconductor chip with a connecting layer; a radiation conversion substance is formed in the connecting layer, a window is formed, in the conversion element; a contact of the semiconductor chip overlaps the window in a plan view of the radiation component; electrical contact can be made or electrical contact is made with the semiconductor chip through the window; and the connecting layer directly adjoins the contact at least in regions.

BRIEF DESCRIPTION OF THE DRAWINGS

FIGS. 1A and 1B show a first example of a radiation-emitting component in schematic plan view (FIG. 1A) and associated sectional view (FIG. 1B).

FIG. 2 shows a second example of a radiation-emitting component in schematic sectional view.

FIG. 3 shows a third example of a radiation-emitting component in schematic sectional view.

FIGS. 4A to 4C show an example of a method of producing a radiation-emitting component on the basis of intermediate steps illustrated schematically in sectional view.

DETAILED DESCRIPTION

My radiation-emitting component may comprise a semiconductor chip having a semiconductor body with an active region provided to generate primary radiation. Furthermore, the radiation-emitting component may comprise a conversion element provided to at least partly convert the primary radiation. The conversion element may be fixed to the semiconductor chip by a connecting layer. A radiation conversion substance may be formed in the connecting layer.

The radiation conversion substance in the connecting layer is provided to absorb at least a portion of the primary radiation and converting it into secondary radiation having a peak wavelength different from a peak wavelength of the primary radiation.

Consequently, the radiation conversion can be effected not only in the preferably prefabricated conversion element, but also in the connecting layer.

Preferably, the connecting, layer projects beyond the conversion element in a lateral direction at least in regions. In this context, a lateral direction is understood to be a direction running along a main extension plane of the active region.

Consequently, the connecting layer can also convert radiation portions which would emerge from the radiation-emitting component past the conversion element and would lead to an intensified angle dependence of the color locus of the emitted radiation.

Preferably, a window is formed in the conversion element. The window expediently extends in a vertical direction, that is to say in a direction running perpendicularly to the main extension plane of the active region, completely through the conversion element.

Preferably, electrical contact can be made or electrical contact is made with the semiconductor chip through the window. In particular, in a region overlapping the window in a plan view of the semiconductor chip, the semiconductor chip can have a contact area provided to externally electrically contact the semiconductor chip, for example, by a wire bonding connection.

The window may be formed laterally with respect to the semiconductor body in a plan view of the semiconductor chip. The semiconductor body is furthermore preferably free of an electrical contact on the side facing the conversion element, in other words, on a radiation passage area of the semiconductor body provided for emission, there is no need for any external electrical contacts that might impede emergence of radiation from the semiconductor body.

Alternatively, the window overlaps the semiconductor body in plan view. Externally electrically contacting a semiconductor layer of the semiconductor body that faces the conversion element is thus simplified.

Preferably, the connecting layer overlaps the window at least in regions in a plan view of the semiconductor chip. In other words, the connecting layer is finned at least partly in regions in which the semiconductor chip is not covered by the conversion element. Consequently, primary radiation emitted in the region of the window can be at least partly converted by the connecting layer. An angle dependence of the color locus of the emitted radiation can thus be reduced more extensively.

The semiconductor body preferably has a side area delimiting the semiconductor body in a lateral direction.

Preferably, the connecting layer covers the side area at least in regions. Consequently, radiation which would emerge from the semiconductor chip laterally, that is to say in a lateral direction, and would thus be emitted from the radiation-emitting component past the conversion element can also be at least partly converted into secondary radiation.

Preferably, the connecting layer is adapted to the conversion element with regard to the conversion of the primary radiation, in particular with regard to the composition of conversion material and/or the concentration of the conversion material. In other words, the connecting layer is arranged embodied such that the proportion of the primary radiation, upon solely passing through the connecting layer, which is converted into secondary radiation, is comparable in magnitude to that in the conversion element.

In particular, at least one conversion substance may be contained in both the conversion element and the connecting layer.

Preferably, the connecting layer contains a polymer material. The polymer material is expediently transparent or at least translucent to the primary radiation generated in the semiconductor chip. Preferably, the connecting layer contains a silicone.

In a method of producing a radiation-emitting component, with a connecting layer, a conversion element may be fixed to a semiconductor chip having a semiconductor body having an active region provided to generate primary radiation, wherein a radiation conversion substance is formed in the connecting layer.

During production, a connecting material for the connecting layer is preferably applied such that, upon arrangement of the conversion element, the material extends beyond a side area delimiting the semiconductor body in a lateral direction. A proportion of a material for the connecting layer extending beyond the conversion element in a lateral direction can be set, in particular, by the quantity of the applied material, the viscosity of the material and/or the thixotropic behavior of the material. In particular, a targeted overflow of the connecting material over the site area of the semiconductor body may be obtained.

Electrical contact may be made with the semiconductor chip, for example, by a wire bonding connection before the conversion element is fixed. The semiconductor chip can be fixed, for example, in a housing of a surface-mountable component (surface mounted device, smd) or on a connection carrier, for instance a circuit board. After electrical contact has been made, the connecting material can be formed onto the electrical contact-connection at least in regions. This ensures, in a simplified manner, that the radiation emerging from the semiconductor body passes through the connecting layer and is thus at least partly converted into secondary radiation.

Alternatively, the connecting layer does not cover the electrical contact or covers the latter at least only in regions. Electrical contact can be made with the semiconductor chip in the exposed region of the contact.

Preferably, the connecting layer, at least in regions, directly adjoins the electrical contact. This ensures in a simple manner that radiation emerging laterally with respect to the contact is at least partly converted into secondary radiation.

The method described is particularly suitable to produce a radiation-emitting component described further above. Features mentioned in connection with the component can therefore also be used for the method, and vice versa.

Further features, configurations and expediencies will become apparent from the following description of the examples in conjunction with the Figures.

Elements that are identical, of identical type or act identically are provided with the same reference signs in the Figures.

The Figures and the size relationships of the elements illustrated in the Figures among one another should not be regarded as to scale. Rather, individual elements may be illustrated with an exaggerated size to enable better illustration and/or to afford a better understanding.

A first example of a radiation-emitting component 1 is shown in schematic plan view FIG. 1A and in a sectional view along the line AA' in FIG. 1B.

The radiation-emitting component 1 comprises a semiconductor chip 2 and a conversion element 3. The conversion element is fixed to the semiconductor chip by a connecting layer 4.

The semiconductor chip 2 has a semiconductor body 20 having a semiconductor layer sequence that forms the semiconductor body. The semiconductor layer sequence comprises an active region 23 provided to generate radiation, the active region arranged between a first semiconductor region 21 and a second semiconductor region 22.

The semiconductor body 20 is fixed on a carrier 6 by a mounting layer 61. The carrier 6 serves, in particular, to mechanically stabilize the semiconductor body 20. A growth substrate for the semiconductor layer sequence of the semiconductor body 20 is not necessary for this purpose and can therefore be removed or thinned completely or at least in regions during production.

A semiconductor chip in which the growth substrate is removed is also designated as a "thin-film semiconductor chip."

A thin-film semiconductor chip for instance a thin-film light-emitting diode chip, can furthermore be distinguished by at least one of the following characteristic features:

1) at a first main area—facing toward a carrier element, for example, the carrier 6—of a semiconductor body comprising a semiconductor layer sequence having an active region, in particular an epitaxial layer sequence, a mirror layer is applied or formed, for instance in a manner integrated as a Bragg mirror in the semiconductor layer sequence, which mirror layer reflects at least one portion of the radiation generated in the semiconductor layer sequence back into the latter;
2) the semiconductor layer sequence has a thickness of 20 μm or less, in particular of 10 μm; and/or
3) the semiconductor layer sequence contains at least one semiconductor layer having at least one area having an intermixing structure which ideally leads to an approximately ergodic distribution of the light in the semiconductor layer sequence, that is to say that it has an as far as possible ergodically stochastic scattering behavior.

A basic principle of a thin-film light-emitting diode chip is described, for example, in I. Schnitzer et al., Apl. Phys. Lett. 63 (16), Oct. 18, 1993, 2174-2176, the subject matter of which is incorporated herein by reference.

The semiconductor body has recesses 55 extending from the carrier 6 through the second semiconductor region 22 and the active region 23 into the first semiconductor region 21. A first connection layer 71 is formed in the recesses 55, the first connection layer being electrically conductively connected to the semiconductor region 21.

The side areas of the recesses 55 are covered with an insulation layer 53. The insulation layer electrically insulates the first connection layer 51 from the active region 23 and the semiconductor region 22.

A second connection layer 52 is formed between the first connection layer 51 and the second semiconductor region 22. The second connection layer 52 electrically conductively connects to the second semiconductor region 22.

The first connection layer 51 and the second connection layer 52 electrically conductively connect to a first contact 91 and a second contact 92, respectively, such that, by an external electrical voltage applied between the contacts 91 and 92, charge carriers are injected via the first connection layer 51 and the first semiconductor region 21 and respectively via the second connection layer 52 and the second semiconductor region 22 from different sides into the active region 23 and can recombine there with emission of radiation.

A radiation exit area 200 of the semiconductor body 20 facing away from the carrier 6 is free of an external electrical contact. Radiation generated in the active region 23 can thus emerge from the semiconductor chip particularly efficiently through the radiation exit area 200. To increase the coupling-out efficiency, the radiation exit area 200 has a structuring 29, for example, a roughening. The structuring can be in a regular or irregular fashion.

The connection layers 51, 52 preferably contain a metal or a metallic alloy or consist of a metal or a metallic alloy. The second connection layer 52 furthermore preferably has a high reflectivity for the radiation generated in the active region 23. Radiation emitted in the direction of the carrier 6 can thus be efficiently deflected in the direction of the radiation exit area 200 and emerge from the latter. By way of example, silver, aluminum, rhodium, chromium or palladium is suitable in the visible spectral range. By way of example, gold has a high reflectivity in the infrared spectral range.

The conversion element 3 is provided to at least partly convert primary radiation generated in the active region 2 into secondary radiation. By way of example, a white color impression can arise for the human eye by superimposing blue primary radiation with yellow secondary radiation. The conversion element 3 can also be provided for complete conversion of the primary radiation. By way of example, in the active region 23, radiation in the ultraviolet spectral range can be generated and subsequently converted into red, green and blue radiation in the conversion element.

The conversion material provided to convert radiation can be embedded into a basic material for the conversion element 3. The basic material for the conversion element can contain, for example, a ceramic, for instance aluminum oxide or a polymer material, for instance a silicone, an epoxide or a mixture composed of a silicone and an epoxide or can consist of such a material.

In the region of the second contact 92, the conversion element 3 has a window 30, through which electrical contact can be made with the semiconductor chip 2 externally, for example, by a wire bonding connection.

The window 30 is arranged laterally with respect to the semiconductor body 20 in a plan view of the semiconductor chip. The conversion element 3 therefore completely covers the radiation exit area 200 of the semiconductor body 20. A spectral emission characteristic of the component 1 that is uniform in a lateral direction across the radiation exit area is thus realized in a simple manner.

A radiation conversion substance 45 is formed in the connecting layer 4, the radiation conversion substance being provided to at least partly convert radiation generated in the active region 23 into secondary radiation. In particular, the radiation conversion substance is provided to at least partly convert that portion of the primary radiation which would emerge from the radiation-emitting component 1 in the case of a completely transparent connecting layer without any radiation conversion. In particular, the connecting layer 4 covers the side areas 201 delimiting the semiconductor body 20 in a lateral direction. This ensures that radiation coupled out from the semiconductor body 20 laterally is at least partly converted.

Preferably, the connecting layer is arranged such that radiation which would emerge from the component past the conversion element 3, for example, radiation emerging laterally from the semiconductor body 20, is converted by the connecting layer 4 in a proportion which corresponds or at least comes close to the conversion proportion of radiation passing through the conversion element 3. What can be achieved in this way is that the radiation-emitted overall by the radiation-emitting component 1 is particularly homogeneous with regard to the color locus. In this context, a homogeneous emission is understood to mean, in particular, that the color locus of the emitted radiation has only a comparatively low dependence on the emission angle.

For a particularly homogeneous emission, the conversion element 3 and the radiation conversion substance 45 of the connecting layer 4 are adapted to one another, in particular with regard to the peak wavelength of the secondary radiation, such that the color locus for radiation converted only in the connecting layer 4 corresponds or at least comes close to the color locus for radiation which also passes through the conversion element 3.

Furthermore, the connecting layer 4 projects beyond the conversion element 3 in the region of the window 30 in a plan view of the semiconductor chip 2. In the example shown, the connecting layer 4 covers the second contact 92 in regions. In the exposed region, the second contact 92 is accessible for external electrical contact-connection.

In a departure therefrom, however, the connecting layer 4 can also need not cover the second contact 92. Preferably, the connecting layer 4 in this case adjoins the second contact at least in regions, particularly preferably along the entire periphery of the second contact 92. An unintentionally high proportion of the primary radiation in the radiation power that emerges overall in the region of the window 30 and an associated inhomogeneity of the color locus can thus be avoided particularly reliably.

The connecting layer 4 preferably contains a radiation-transmissive polymer material, for example, a silicone.

In the example shown, the carrier 6 is expediently electrically conductive. By way of example, the carrier 6 can contain a doped semiconductor material, for example, silicon, geranium or gallium arsenide, or can consist of such a material. A metal or a metallic alloy can also be used for the carrier. In a departure from the example shown, the carrier 6 can also be an electrically insulating carrier, for example, a ceramic carrier provided with contact through holes.

Furthermore, the first contact 91 can also be arranged on that side of the first connection layer 51 facing away from the carrier 6. In this case, the injection of charge carriers into the component 1 is independent of the electrical properties of the carrier such that a fully electrically insulating carrier, for example, a sapphire carrier can also be used.

In a departure from the example described, it is also possible to use a semiconductor chip in which the growth substrate is not removed, for example, a flip-chip semiconductor chip with a sapphire growth substrate as a carrier.

A second example of a radiation-emitting component is illustrated in schematic sectional view in FIG. 2. This example substantially corresponds to the first example described in connection with FIG. 1.

In contrast thereto, the first contact 91 is formed to make electrical contact with the first semiconductor region 21 on the radiation exit area 200 of the semiconductor body 20. Consequently, to make electrical contact with the first semiconductor region, there is no need for any recesses through the active region 23.

The window 30 in the conversion element 3 is arranged as in the first example such that the first contact 91 is exposed to facilitate external electrical contact.

A mirror layer 62 is arranged between the carrier 6 and the semiconductor body the mirror layer provided to deflect radiation generated in the active region 23 and emitted in the direction of the carrier 6. In particular, one of the materials mentioned in association with the second connection layer 72 is suitable for the mirror layer 62.

As described in connection with FIG. 1, the radiation exit area 200 can have a structuring (not shown explicitly). An interface between the first semiconductor region 21 and the first contact 91 is preferably excluded from the structuring. Thus, reflectivity of the first contact 91 for radiation generated in the active region 23 can be increased and the proportion of radiation absorbed at the first contact can therefore be reduced.

A third example of a radiation-emitting component 1 is shown in schematic sectional view in FIG. 3. The semiconductor chip 2 and the conversion element 3 can be as described in connection with FIGS. 1 and 7.

In this example, the semiconductor chip is fixed in a prefabricated housing 7 for a surface-mountable component. The housing 7 has a leadframe having a first connection conductor 71 and a second connection conductor 72. The connection conductors project from opposite sides out of a housing body 75, for example, a plastic body formed onto the leadframe. The housing 7 furthermore has a thermal connection 73 on which the semiconductor chip 2 is fixed, in contrast to the first connection conductor 71 and to the second connection conductor 72, the thermal connection is predominantly not provided for electrical contact-connection, but rather to efficiently dissipate waste heat generated during operation from the semiconductor chip 2.

The first contact 91 of the semiconductor chip 2 electrically conductively connects to the first connection conductor 71 via a connecting line 74, for instance a bonding wire connection.

The connecting layer 4 is formed onto the connecting line 74 and covers that part of the first contact 91 not covered by the connecting line 74. In this example, therefore, the connecting layer is only applied after electrical contact has already been made with the semiconductor chip 2 by the connecting line 74.

The semiconductor chip 2 and the connecting line 74 are embedded into an encapsulation 76 which protects the semiconductor chip against external influences, for example, moisture or mechanical loading. In particular, a transparent or at least translucent polymer material, for example, an epoxide, a silicone or a mixture composed of an epoxide and a silicone, is suitable for the encapsulation.

An example of a method of producing a radiation-emitting component 1 is illustrated on the basis of intermediate steps in schematic sectional view in FIGS. 4A to 4C. The method is described on the basis of a radiation-emitting component as described in connection with FIG. 2. It goes without saying, however, that a semiconductor chip 1 of the first example can also be used.

As illustrated in FIG. 4A, a semiconductor chip 2 having a semiconductor body 20 is provided.

A connecting material 40 into which a radiation conversion substance 45 is embedded is applied on the semiconductor body 20. The application can be effected, for example, by a dispenser (FIG. 4B). Afterward, a prefabricated conversion element 3, produced by screen printing, for example, is positioned relative to the semiconductor body 20. The conversion element 3, is placed onto the connecting material 40. Preferably, the connecting material is arranged, in particular with regard to thixotropy, viscosity and applied quantity, such that, during application of the conversion element 3, the connecting material runs over the side areas 201 of the semiconductor both and covers them. The conversion element 3 is therefore fixed such that the connecting material 40 for the connecting layer 4 in a plan view of the semiconductor chip, extends beyond the conversion element and covers regions of the semiconductor chip 2, in particular of the semiconductor body 20, which would otherwise be uncovered.

Material that covers the first contact 91 can subsequently be removed completely Or at least in regions such that the first contact is exposed for external electrical contact-making. This can be done, for example, by coherent radiation or chemically, for instance by wet-chemical or dry-chemical etching.

A complete component is shown in FIG. 4C.

In a departure from the example described, the connecting material can also be formed on the conversion element 3 such that the conversion element 3 is applied together with the connecting material 40 to the semiconductor chip 2.

Furthermore, the connecting material 40, as described in association with FIG. 3, can also be applied only after the semiconductor chip 2 has already been fixed and electrically contact-connected, for example, in a housing for the component or on a connection carrier, for instance a circuit board, for example, a printed circuit board (PCB). In this case, therefore, the connecting material is applied only after production of an electrical contact-connection with the first contact such that material running onto the first contact can remain on the first contact 91.

With the method described here, a radiation-emitting component having a color locus homogeneous over the emission angle can be produced in a simple manner. The risk of inhomogeneities of the color locus on account of a primary radiation emitted laterally at the conversion element can be reduced to the greatest possible extent in a simple and reliable manner.

My components and methods are not restricted by the description on the basis of the examples. Rather, this disclosure encompasses any novel feature and also any combination of features, which in particular includes any combination of features in the appended claims, even if the feature or combination itself is not explicitly specified in the claims or the examples.

The invention claimed is:

1. A radiation-emitting component comprising a semiconductor chip having a semiconductor body with an active region that generates a primary radiation, and comprising a conversion element that at least partly converts the primary radiation, wherein the conversion element is fixed to the semiconductor chip with a connecting layer, a radiation conversion substance is formed in the connecting layer, a window is formed in the conversion element, through which window electrical contact can be made or electrical contact is made with the semiconductor chip, and the connecting layer overlaps the window at least in regions in a plan view of the semiconductor chip.

2. The radiation-emitting component according to claim 1, wherein the connecting layer projects beyond the conversion element in a lateral direction at least in regions.

3. The radiation-emitting component according to claim 1, wherein the window is formed laterally with respect to the semiconductor body in a plan view of the semiconductor chip.

4. The radiation-emitting component according to claim 1, wherein the connecting layer covers at least in regions a side area delimiting the semiconductor body in a lateral direction.

5. The radiation-emitting component according to claim 1, wherein the connecting layer contains a polymer material.

6. The radiation-emitting component according to claim 1, wherein the connecting layer is adapted to the conversion element with regard to conversion of the primary radiation.

7. The radiation-emitting component according to claim 1, wherein the semiconductor body is free of an electrical contact on a side facing the conversion element.

8. The radiation-emitting component according to claim 1, wherein the semiconductor chip comprises a contact to externally electrically contact the semiconductor chip and the contact overlaps the window in a plan view of the semiconductor chip.

9. The radiation-emitting component according to claim 8, wherein the connecting layer adjoins the contact at least in regions.

10. The radiation-emitting component according to claim 8, wherein the connecting layer adjoins the contact along the entire periphery of the contact.

11. The radiation-emitting component according to claim 8, wherein the connecting layer covers the contact in regions.

* * * * *